United States Patent
Fürst et al.

(10) Patent No.: US 10,256,718 B2
(45) Date of Patent: Apr. 9, 2019

(54) LOW-INDUCTANCE HALF-BRIDGE ARRANGEMENT

(71) Applicant: Siemens Aktiengesellschaft, München (DE)

(72) Inventors: Johannes Fürst, Stöckelsberg (DE); Marvin Tannhäuser, Möhrendorf (DE)

(73) Assignee: Siemens Aktiengesellschaft, München (DE)

( * ) Notice: Subject to any disclaimer, the term of this patent is extended or adjusted under 35 U.S.C. 154(b) by 0 days.

(21) Appl. No.: 15/891,083

(22) Filed: Feb. 7, 2018

(65) Prior Publication Data
US 2018/0226886 A1 Aug. 9, 2018

(30) Foreign Application Priority Data

Feb. 8, 2017 (EP) ..................... 17155207

(51) Int. Cl.
| | | |
|---|---|---|
| *H02M 1/42* | (2007.01) | |
| *H02M 1/088* | (2006.01) | |
| *H05K 1/02* | (2006.01) | |
| *H02M 7/00* | (2006.01) | |
| *H02M 7/483* | (2007.01) | |

(52) U.S. Cl.
CPC ......... *H02M 1/4233* (2013.01); *H02M 1/088* (2013.01); *H02M 7/003* (2013.01); *H05K 1/0228* (2013.01); *H05K 1/0265* (2013.01); *H02M 2007/4835* (2013.01); *H05K 2201/09236* (2013.01); *H05K 2201/09672* (2013.01); *H05K 2201/10015* (2013.01)

(58) Field of Classification Search
CPC ..................................................... H02M 7/003
See application file for complete search history.

(56) References Cited

U.S. PATENT DOCUMENTS

| | | |
|---|---|---|
| 5,036,160 A | 7/1991 | Jackson |
| 5,357,050 A | 10/1994 | Baran et al. |
| 6,365,828 B1* | 4/2002 | Kinoshita ............. H01L 23/552 174/359 |
| 2014/0111174 A1* | 4/2014 | Shtargot ............. H01L 27/0207 323/282 |
| 2014/0183550 A1 | 7/2014 | Reusch et al. |
| 2017/0093285 A1* | 3/2017 | Sasao ..................... H02M 3/158 |
| 2017/0294859 A1* | 10/2017 | Marvin ................... H02P 27/04 |
| 2017/0353119 A1* | 12/2017 | Uchida ................... H02M 1/44 |

FOREIGN PATENT DOCUMENTS

EP         0400885 A1    12/1990

* cited by examiner

*Primary Examiner* — Harry R Behm
(74) *Attorney, Agent, or Firm* — Henry M. Feiereisen LLC (57) ABSTRACT

The switching performance of a half-bridge arrangement particularly for a converter shall be improved. For this purpose, a half-bridge arrangement has a circuit board having at least four trace layers and two switching elements and a capacitor device arranged on opposite sides of the circuit board and interconnected so as to produce, during a commutation event of the half-bridge arrangement, at least two dipoles having opposite spatial directions.

12 Claims, 7 Drawing Sheets

LOW-INDUCTANCE HALF-BRIDGE ARRANGEMENT

CROSS-REFERENCES TO RELATED APPLICATIONS

This application claims the priority of European Patent Application, Serial No. 17155207.8, filed Feb. 8, 2017, pursuant to 35 U.S.C. 119(a)-(d), the content of which is incorporated herein by reference in its entirety as if fully set forth herein.

BACKGROUND OF THE INVENTION

The present invention relates to a half-bridge arrangement for a converter, comprising two switching elements, a capacitor device and a circuit board to which the switching elements and the capacitor device are interconnected to form a half bridge. The present invention also relates to a converter having such a half-bridge arrangement.

The following discussion of related art is provided to assist the reader in understanding the advantages of the Invention, and is not to be construed as an admission that this related art is prior art to this invention.

Figure 1:
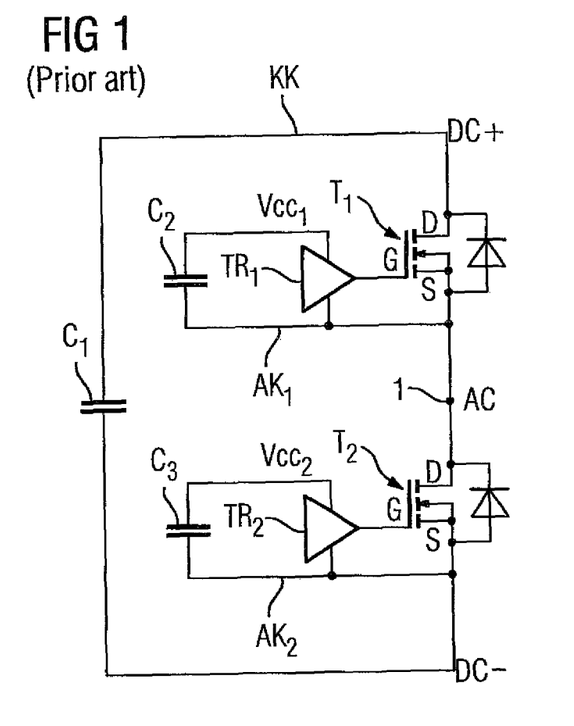
FIG. 1 shows a circuit diagram of a half bridge with drive circuitry according to the prior art.

A half bridge is a basic building block in power electronics. It is used, for example, in most step-up converter, step-down converter and current and voltage transformer topologies. FIG. 1 shows a circuit diagram of a half-bridge arrangement with drive circuitry according to the prior art. The half-bridge arrangement comprises two switching elements $T_1$ and $T_2$ which can both be implemented as a MOSFET with parallel freewheel diode. The two switching elements are Interconnected at a node 1 at which the output voltage (generally an AC voltage) is usually present. In this example, the source S of the first switching element $T_1$ is connected to the drain D of the second switching element $T_2$ via the node 1. The drain D of the first switching element $T_1$ is usually at the positive DC voltage potential DC+ and is connected to one terminal of a DC-link capacitor $C_1$. Likewise in the example, the source S of the second switching element $T_2$ is at a negative DC voltage potential DC− and is connected to the other terminal of the DC-link capacitor $C_1$.

The gate G of the first switching element $T_1$ is connected to the output of the first driver $TR_1$. Connected to the supply terminals of the first driver $TR_1$ is a capacitor $C_2$ which provides a first supply voltage $Vcc_1$. The first driver $TR_1$ derives its reference potential from the source S of $T_1$.

The second switching element $T_2$ and a second driver $TR_2$ are in a similar configuration. The output of this driver is connected to the gate G of the transistor of the second switching element $T_2$. The supply terminals of the driver $TR_2$ are connected to a capacitor $C_3$ which provides a supply voltage $Vcc_2$. The reference potential for the second driver $TR_2$ is again the source S of the second switching element $T_2$.

An important factor for the switching performance of the half bridge is the parasitic Inductance in the commutation circuit. The commutation circuit is the circuit in which the current changes during a switching operation. This commutation circuit KK is shown in FIG. 1 and passes through the switching elements $T_1$, $T_2$ and $C_1$. Parasitic inductances are also produced by a first drive circuit AK1 at the first driver $TR_1$ and a second drive circuit AK2 at the second driver $TR_2$. The respective drive circuits AK1 and AK2 pass via the source S and gate G to the outputs of the respective drivers $TR_1$ and $TR_2$, via the respective supply terminal to the respective capacitors $C_2$ and $C_3$ and back to the source S.

In power electronics there is a trend toward higher switching frequencies. As a result, passive components (inductors and capacitors) may be made smaller in many circuits. However, this causes higher switching losses in the components (especially in the case of "hard" switching when the current or voltage are non-zero), as more switching operations take place as the frequency increases. The switching losses are proportional to the switching current, the switching voltage and the switching time. For the same requirement placed on the system (current and voltage are fixed), these can be reduced by faster switching edges. The faster rise or fall times of current and voltage cause overvoltages and put an additional load on the interference immunity in the circuit. The largest effect is produced here by the leakage or parasitic inductances in the commutation circuit KK and in the drive circuits $AK_1$ and $AK_2$ as shown in FIG. 1.

Particularly at higher powers (higher currents), so-called high-copper circuit boards are used in which the thickness of the copper layer is significantly increased compared to normal types. There, because of the large copper cross-sections and the usual ramps at the board edges, the distances between the components and therefore the Inductances of the current paths are greater. This gives rise to conflicting objectives in the case of high powers and high frequencies.

In addition, switching and on-state power losses in the form of heat are engendered in the power semiconductors. This heat has to be dissipated in order to cool the semiconductors and therefore to be able to use them more intensively.

Figure 2:
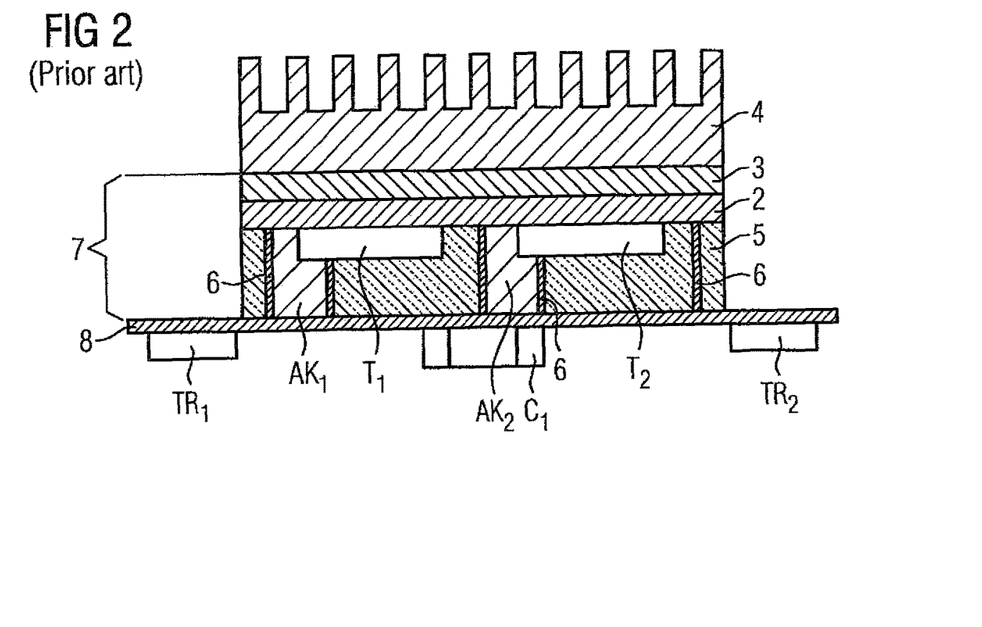
FIG. 2 shows a basic cross-sectional view of a half bridge module having a drive circuit according to the prior art.
Figure 3:
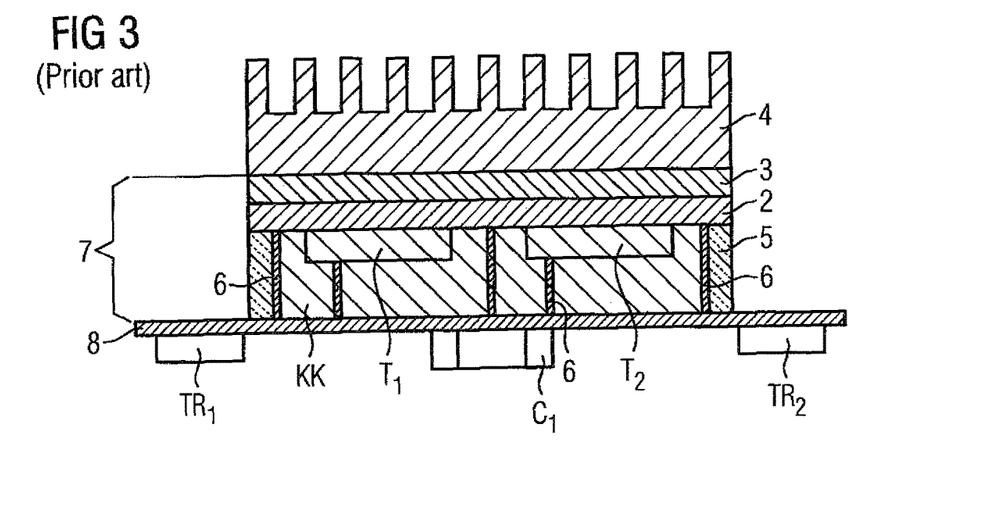
FIG. 3 shows a cross-section of FIG. 2 with a commutation circuit.

The problems mentioned are minimized in different approaches. However, each problem is mainly approached individually, resulting in conflicts. For example, so-called modules as shown in FIGS. 2 and 3 are used for heat dissipation. There, the power semiconductors, i.e. switching elements $T_1$ and $T_2$, are mounted on a DCB substrate 2 (Direct Copper Bonding). The DCB substrate 2 is mostly fixed to an aluminum base plate 3. A heat sink 4 is disposed on the opposite side of the aluminum base plate 3. The switching elements $T_1$ and $T_2$ are encapsulated in an insulator 5 through which interconnects 6 project. A module 7 is therefore formed by the aluminum base plate 3, the DCB substrate 2 and the insulator layer 5 with the encapsulated switching elements $T_1$ and $T_2$ and the interconnects 6. The module 7 is attached to a circuit board 8 on the side opposite the heat sink 4. The interconnects 6 constitute the electrical connections from the switching elements $T_1$ and $T_2$ to the circuit board 8. The DC-link capacitor $C_1$ and the drivers $TR_1$ and $TR_2$ can be disposed on the opposite side of the circuit board 8.

In FIG. 2 it is indicated that the drive circuits $AK_1$ and $AK_2$ are basically created between internal interconnects 6 and the DCB substrate 2 and the circuit board 8, whereas, as shown in FIG. 3, the commutation circuit KK is created between the external interconnects 6 and the DCB substrate 2 and circuit board 8. It is not automatically possible to optimize the leakage inductances of the drive circuits $AK_1$, $AK_2$ and of the commutation circuit KK, as the inductances are dominated by the module 7. Because of this, these designs are generally unsuitable for higher switching frequencies.

Another approach is to design using discrete elements such as THT components (Through-Hole Technology) and SMD components (Surface Mounted Device). As in the case of module-type design, THT semiconductors offer only limited scope for low-inductance connection. Although this design also allows a connection to a heat sink to be provided, high frequencies are only rarely realized, and it will therefore not be discussed further here.

Figure 4:
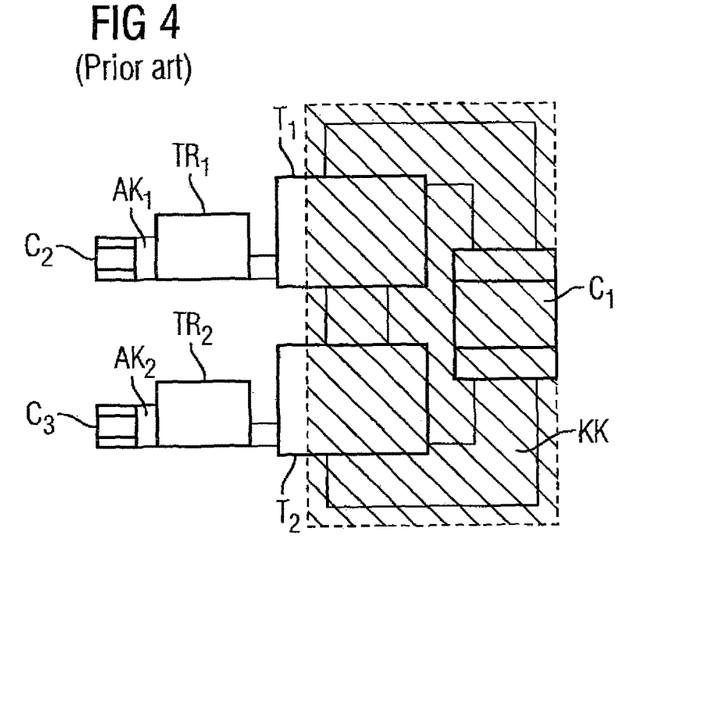
FIG. 4 shows a diagram of the control circuitry and of the commutation circuit with one-sided component placement according to the prior art.

SMD circuit board design provides greater optimization potential here in respect of higher frequencies. Two frequently used designs will now be shown in connection with FIG. 4 and FIG. 5, namely one-sided and two-sided component placement. FIG. 4 shows the one-sided placement variant. Here all the components $T_1$, $T_2$, $TR_1$, $TR_2$, $C_1$, $C_2$ and $C_3$ are disposed on one side of a board (not shown). The drive circuits $AK_1$, $AK_2$ and the commutation circuit KK are located in one plane. Maximum optimization of the leakage inductance here resides in the size of the discrete elements. For this variant, heat dissipation is difficult to achieve for the power electronics.

Figure 5:
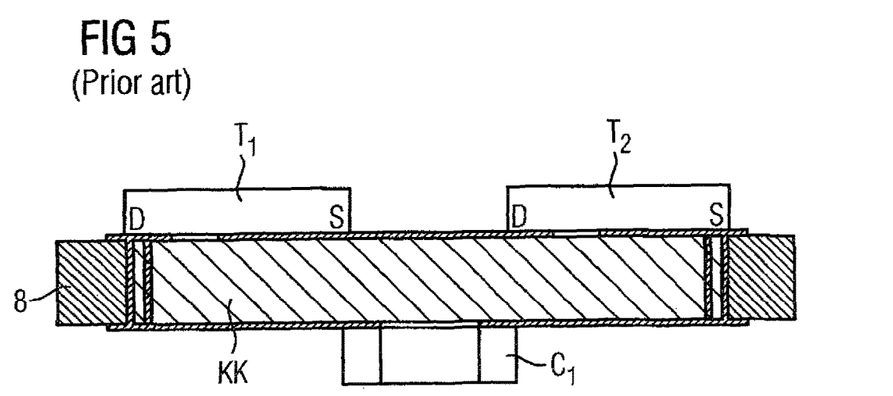
FIG. 5 shows a cross-section through a circuit board with two-sided component placement with commutation circuit according to the prior art.

The two-sided placement variant as shown in FIG. 5 mainly uses the same drive circuitry as in FIG. 4 and differs primarily in that one of the three main components $T_1$, $T_2$ or $C_1$ is on the back of the board 8. As can be seen from FIG. 5, the commutation circuit KK is dependent on the thickness of the board 8 (e.g. 1.6 mm). However, heat dissipation from the high-side switch $T_1$ in particular is also difficult with this design, as most discrete power semiconductors refer their thermal pad for heat dissipation to source potential and this must be kept small for interference immunity reasons.

Figure 6:
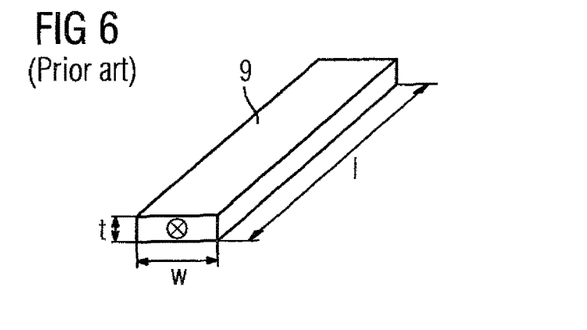
FIG. 6 shows a diagram of an individual circuit trace for calculating the leakage inductance.
Figure 7:
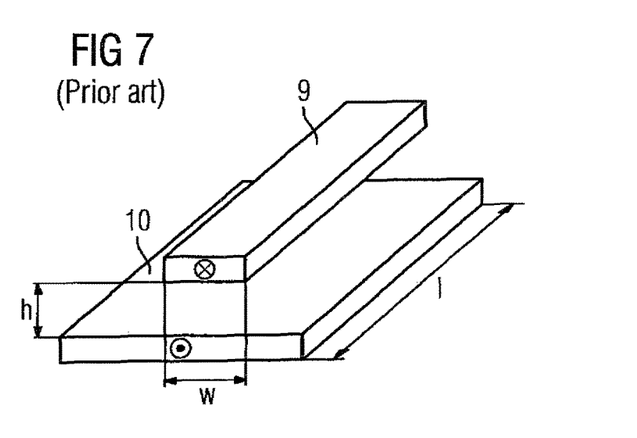
FIG. 7 shows a diagram of two parallel circuit traces for calculating the leakage inductance.

Any leakage inductances L can be estimated using the formulas below. This enables qualitative design improvements to be achieved. Formula [1] below relates, as shown in FIG. 6, to a conductor 9 and 10 which is in no or virtually no field of another conductor. Formula [2] relates, as shown in FIG. 7, to the case that two conductors with contrary flow directions are positioned opposite one another. The respective geometric dimensions t, w, l of the conductors 9 and 10 and, where applicable, their spacing h are marked in FIGS. 6 and 7 and used in the respective formulas [1] and [2] below.

$$L = 2 \times l \times \left[ \ln\left[ \times \left(\frac{l}{t+w}\right) + 0.5 \right] \times \frac{nH}{cm} \right] \quad [1]$$

$$L = \frac{2 \times h}{w} \times l \times \frac{nH}{cm} \quad [2]$$

Figure 8:
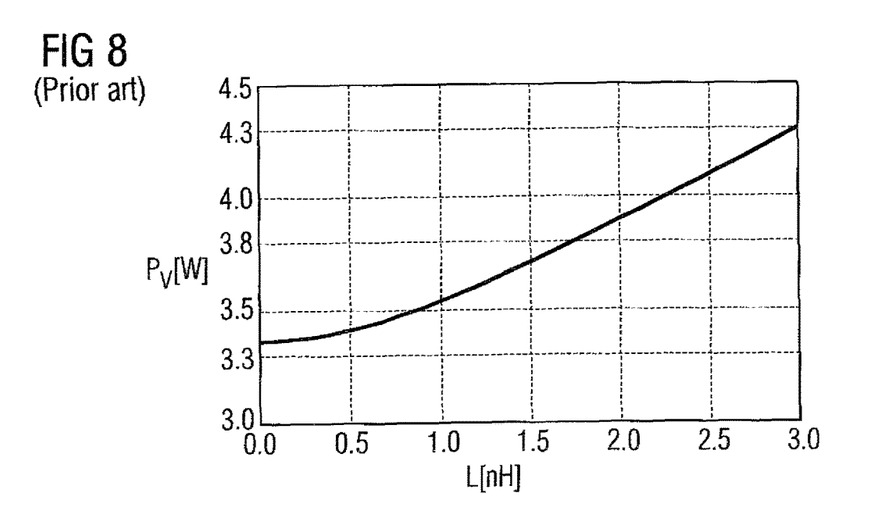
FIG. 8 shows effects of the losses due to commutation inductance according to the prior art.

The effect of the commutation inductance on the losses in a half bridge can be observed in FIG. 8. This shows power loss $P_v$ versus leakage inductance L. The power loss $P_v$ increases constantly toward higher leakage inductances. This effect is noticeable particularly at higher frequencies and currents as the main loss component in this half bridge configuration.

It would therefore be desirable and advantageous to obviate prior art shortcomings and to provide an improved half-bridge arrangement which is less sensitive to switching events.

SUMMARY OF THE INVENTION

According to the present invention, a half-bridge arrangement for a converter is provided, comprising two switching elements, a capacitor device and a circuit board to which the switching elements and the capacitor device are interconnected to form a half bridge. The half-bridge arrangement can in principle also be used for other purposes apart from converters. IGBTs, but also other power switches, can be used for the two switching elements. The capacitor device is used to store or buffer energy and is typically implemented as a DC-link capacitor. The switching elements are disposed in a usual manner on a circuit board and interconnected to form a half bridge which is connected to the capacitor device.

The circuit board has at least four trace layers. This makes it possible for current loops perpendicular to the main surface of the circuit board to be formed within the circuit board when there is a commutation event. During such an event when the switch state of one or both of the switching elements changes, at least one commutation circuit is created whose parasitic inductance is important for the switching performance of the half-bridge arrangement. Advantageously, the switching elements and the capacitor device are disposed on the circuit board and connected by means of the circuit trace layers such that, during a commutation event, at least two dipoles of opposite direction are produced in the circuit board. Two parallel commutation circuits are thus created whose respective currents produce dipoles of opposite direction. The fact that the dipoles are of opposite direction causes their effects to be mutually attenuated, resulting in an improvement in the switching performance of the half-bridge arrangement.

The half-bridge device advantageously has two capacitors or another even number of capacitors which are disposed symmetrically on the circuit board. A symmetrical arrangement of this kind enables identically dimensioned dipoles of opposite direction to be generated during a commutation event, i.e. in the event of a commutation.

In addition, the switching elements and the capacitors can be disposed on both sides of the circuit board. The advantage of this is that, for example, a point-symmetric arrangement of the components can be achieved. In such an arrangement, sufficient cooling surface area can be provided on both sides of the circuit board simultaneously.

The switching elements and the capacitor device can also be arranged and interconnected such that during a commutation event two dipoles of opposite direction are produced in two different spatial directions in each case. For the design of the half-bridge arrangement, not just one but at least two spatial directions that are different from one another and non-parallel are therefore used for the dipoles. For the respective opposing dipoles, one of the dipoles is then aligned with the spatial direction and the other dipole is oriented counter to this spatial direction. The same applies to the at least one other spatial direction.

In a specific embodiment, the circuit board can have four trace layers, and at least four parallel commutation circuits occur during a commutation event. The objective is to minimize the total parasitic inductance of the half-bridge arrangement. As the commutation circuits are connected in parallel with one another, it is advantageous if one of the commutation circuits has a very small inductance. The resulting total inductance is then smaller than the smallest individual inductance. The objective can be more easily met the more commutation circuits are available. Thus a half-bridge arrangement whose circuit board has more than four trace layers can also be implemented such that more than four commutation circuits can be created.

The commutation circuits are preferably disposed symmetrically with respect to one another. This means that the commutation currents cancel each other out, resulting in reduced noise emission.

In another embodiment, the half-bridge arrangement has a driver device which is disposed such that a driver current direction of a main current of the driver device is perpendicular to a commutation current direction of a main current in the commutation circuit during a commutation event. This can prevent the driver circuit or more specifically the driver device from being easily coupled into the commutation circuit or more specifically the switching elements of the commutation circuit and the switching performance of the half-bridge arrangement from being affected. Due to the perpendicular arrangement of the driver current direction and the commutation current direction, it can rather be achieved that the currents of the circuits in question have little effect on one another.

In another advantageous embodiment, a center tap of the half bridge is made as small as possible, in particular less than five percent of the circuit board. The center tap of the half bridge conventionally produces an AC voltage. If the center tap is therefore made as small as possible, the interference immunity of the entire half-bridge arrangement is increased, as there is less coupling to other components or devices.

In addition, the circuit trace layers can each have a copper fill factor that is as high as possible. This has advantages in respect of conducting heat away from the half-bridge arrangement. In fact, not only the circuit board substrate but in particular the copper is then used for heat dissipation, the latter possessing a very high coefficient of thermal conduction.

In a particular application, a converter is equipped with the above mentioned half-bridge arrangement. In the case of converters, the commutation events occur continuously, which means that it is particularly necessary for them that the switching performance is as far as possible not subject to parasitic inductances.

BRIEF DESCRIPTION OF THE DRAWING

Other features and advantages of the present invention will be more readily apparent upon reading the following description of currently preferred exemplified embodiments of the invention with reference to the accompanying drawing, in which.

DETAILED DESCRIPTION OF PREFERRED EMBODIMENTS

Throughout all the figures, same or corresponding elements may generally be indicated by same reference numerals. These depicted embodiments are to be understood as Illustrative of the invention and not as limiting in any way. It should also be understood that the figures are not necessarily to scale and that the embodiments are sometimes illustrated by graphic symbols, phantom lines, diagrammatic representations and fragmentary views. In certain instances, details which are not necessary for an understanding of the present invention or which render other details difficult to perceive may have been omitted.

The examples described in more detail below are preferred embodiments of the present invention. It should be noted that the individual features can be implemented not only in the feature combinations described, but on a stand-alone basis or in other technically meaningful combinations.

The examples refer to a half-bridge arrangement that is preferably used in a converter. The individual devices and components are to be designed according to the required powers.

A particular focus of attention is the arrangement of the components and the design of the circuit board 8. The components here include in particular those of the half bridge itself including the driver components and the component or components of the capacitor device.

Figure 9:
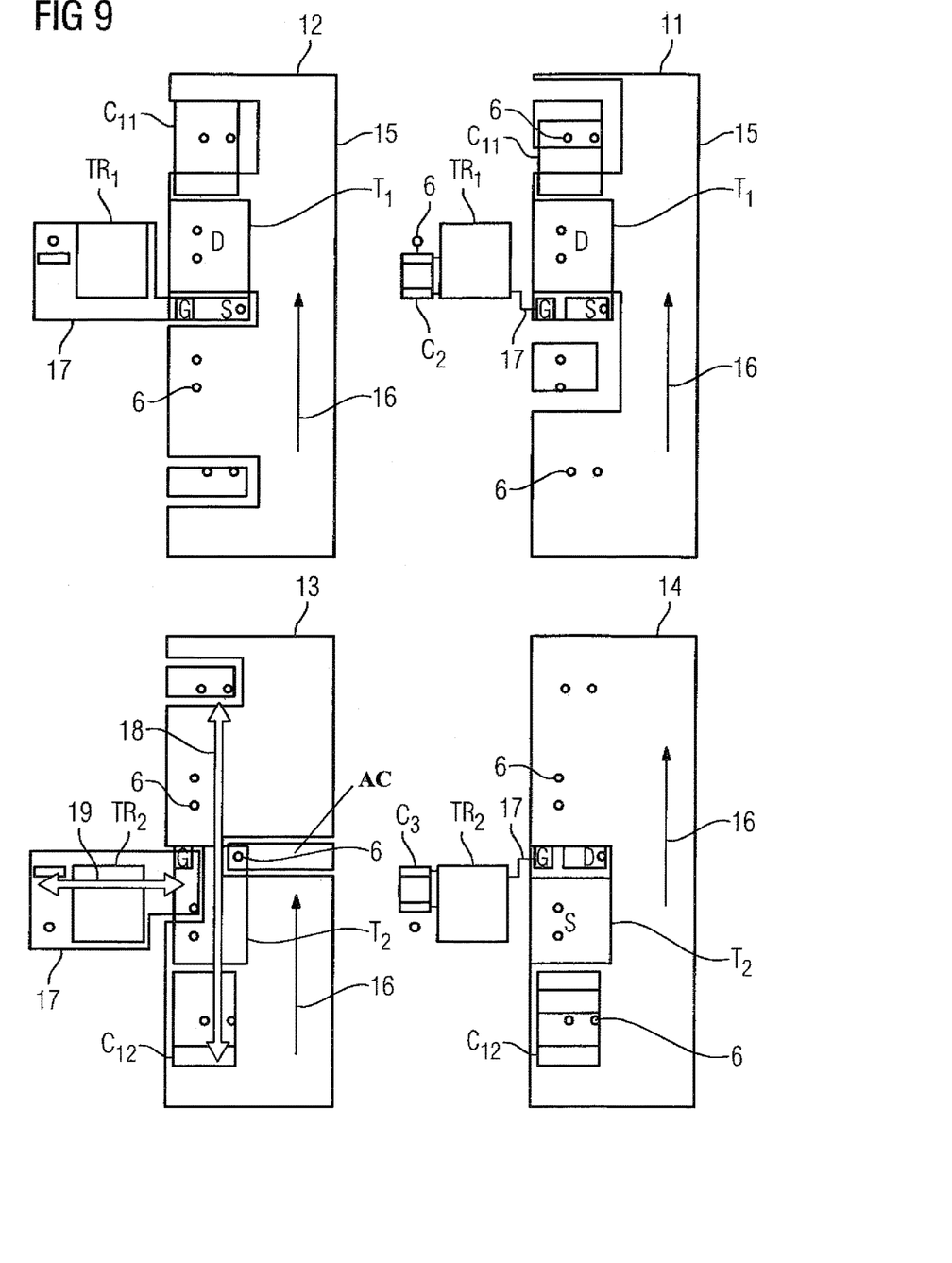
FIG. 9 shows a plurality of trace layers of a circuit board for a half-bridge arrangement according to the invention.
Figure 10:
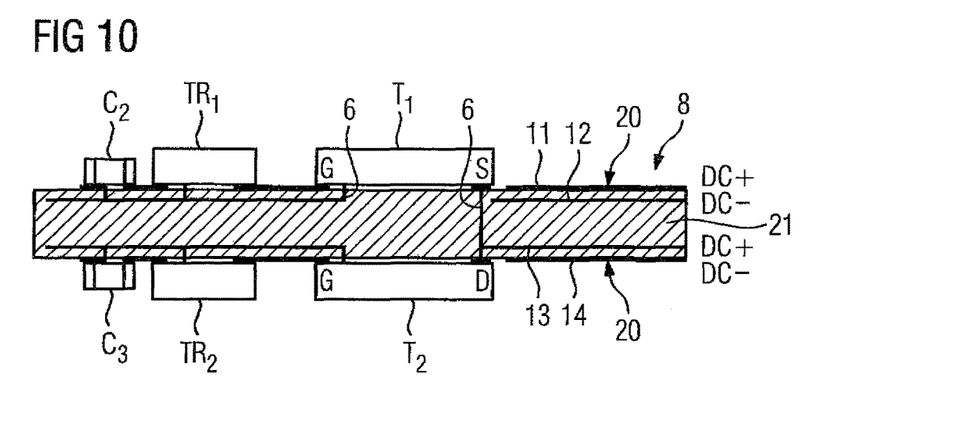
FIG. 10 shows a cross-section through a drive circuit.
Figure 11:
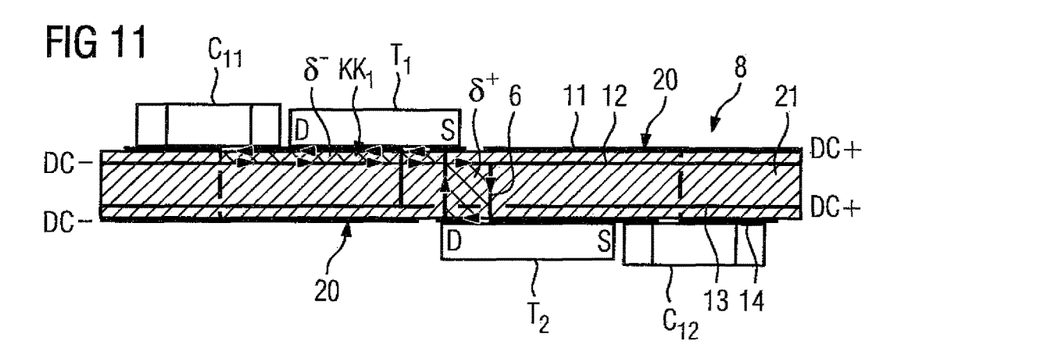
FIG. 11 shows a cross-section through a circuit board along the switching elements with a first commutation circuit.

FIG. 9 shows four layers 11, 12, 13 and 14 of a typical circuit board. Each layer represents a corresponding conductor or copper layer. For example, the first layer 11 and the third layer 13 are at positive potential DC+ and the second layer 12 and fourth layer 14 at negative potential DC−. In addition to the circuit trace layers 11 to 14, the components and via holes or interconnects 6 directly assigned to the circuit trace layers are also marked on FIG. 9. Vertical stacking of the individual layers 11 to 14 produces a circuit board or more specifically half-bridge arrangement having the cross-sections as shown in FIG. 10 and FIG. 11.

Each of the four layers 11 to 14 has a main section 15 which is here rectangular and whose longitudinal direction 16 extends parallel with the orientation of the series arrangement of the switching elements $T_1$ and $T_2$. It should be noted that the switching elements $T_1$ and $T_2$ are on different sides of the circuit board 8. In this example, the DC-Ink capacitor is implemented by two capacitors $C_{11}$ and $C_{12}$. These two capacitors are also on different sides of the circuit board 8 (cf. FIG. 11). In their arrangement, the two capacitors $C_{11}$ and $C_{12}$ are on the same line as the series arrangement of the switching elements $T_1$ and $T_2$, i.e. parallel to the longitudinal direction 16. The cross-section through the circuit board arrangement according to FIGS. 11 to 14 runs parallel to the longitudinal direction 16.

A driver section 17 is located on a long side of each main section 15 of each layer 11 to 14. This driver section 17 is used for contacting the elements of the respective driver or drive circuits $AK_1$ and $AK_2$ (cf. FIG. 1). Thus the driver sections 17 of the first layer 11 and of the second layer 12 connect the driver $TR_1$ and the capacitor $C_2$ to the associated switching element $T_1$. Similarly, the driver sections 17 of the third layer 13 and of the fourth layer 14 connect the second driver $TR_2$ and the capacitor $C_3$ to the second switching element $T_2$. In addition, for the individual layers, the so-called "pads" for contacting the switching elements $T_1$ and $T_2$ can be seen. In particular, the pads for drain D, source S and gate G of the switching elements $T_1$ and $T_2$ are indicated.

Also marked in the third layer 13 is a commutation current direction 18 running parallel to the longitudinal direction 16. The commutation current flows along this commutation current direction 18 through the components $T_1$, $T_2$, $C_{11}$ and $C_{12}$. The double arrow of the commutation current direction 18 indicates that the commutation current can also run contrary to the longitudinal direction 16.

A driver current direction 19 is produced perpendicular to the longitudinal direction 16. A main flow direction of the driver current therefore corresponds to the driver current direction 19. As the double arrow again indicates, the driver current can run in two opposite directions. The fact that the driver current direction 19 and the commutation current direction 18 run perpendicular to one another, i.e. the drive path is at right angles to the commutation path, is a particularly noteworthy aspect. As a result, the current flows and therefore also the H-fields thereof are oriented predominantly orthogonally with respect to one another, which means that they have little effect on each other. This increases the interference immunity of the half-bridge arrangement.

As mentioned above, one switching element $T_1$ with drive arrangement $TR_1$ and $C_2$ is on one side of the circuit board 8, e.g. the top side, and the other switching element $T_2$ with drive arrangement $TR_2$ and $C_3$ is on the other side, e.g. the underside. As a result, the switching elements and associated drivers are thermally decoupled. Heat can be removed via the vacant surfaces 20 (cf. FIGS. 10 and 11). The spread of heat over the surface area can be increased by the thickness of the copper layer and the copper fill factor of the inner layers. Heat dissipation of this kind is generally more effective than heat dissipation via the substrate 21 of the circuit board 8. It is preferable here to use a switching element having a "thermal pad" at the drain terminal. This thermal pad is made larger than the other terminals for gate G and source S. It is also preferable that the potentials of the individual layers 11 to 14 alternate, e.g. DC+, DC−, DC+, DC−.

FIG. 10 shows a cross-section along the driver current direction 19 through the completely assembled circuit trace arrangement or more specifically half-bridge arrangement. The individual circuit trace layers 11 to 14 are stacked to form the (here) four-layer circuit board 8, insulated by the circuit board substrate 21. Directly mounted on the first circuit trace layer 11 are the components $T_1$, $TR_1$ and $C_2$ and directly on the fourth circuit trace layer 14 the components $T_2$, $TR_2$ and $C_3$. A via hole or interconnect 6 connects the source S of switch element $T_1$ to the drain D of switching element $T_2$. Other interconnects 6 are marked between the first circuit trace layer 11 and the second circuit trace layer 12 and between the third circuit trace layer 13 and the fourth circuit trace layer 14.

FIG. 10 shows the particular design on the drive circuitry for $T_1$ and $T_2$. The gate G is connected on the respective outer layer and a layer below is connected back again on an unloaded source terminal of planar design of the respective switching element $T_1$ or $T_2$. This not only reduces the drive inductance, but also increases the interference immunity.

FIGS. 11 to 14 show, in schematic form, cross-sections through the circuit board arrangement or more specifically half-bridge arrangement parallel to the commutation current direction 18 i.e. the longitudinal direction 16. Particularly noticeable here is the point symmetry of the arrangement of the components $T_1$, $T_2$, $C_{11}$ and $C_{12}$. This symmetry gives rise to specific conditions with regard to the respective commutation circuits. Examples of these commutation circuits are shown in FIGS. 11 to 14. They are created simultaneously during a commutation event, i.e. a change of switch state of the switching elements $T_1$ and/or $TR_2$.

In FIG. 11 a first commutation circuit $KK_1$ is marked. It begins in the first circuit trace layer 11 at capacitor $C_{11}$ (part of the DC-link capacitor $C_1$), runs via the second layer 12 and an interconnect to the source S of $T_2$ (fourth layer 14), then to the drain D of $T_2$, onward via an interconnect 6 to the source S and drain D of $T_1$ (first layer 11), and back to the other terminal of capacitor $C_{11}$. This creates two current meshes running contrary to one another. Thus, according to the "right-hand rule", this results in a dipole $\delta^+$ and an opposing dipole $\delta^-$. The effect of the two dipoles of the first commutation circuit $KK_1$ is therefore reduced because of their opposite directions.

Figure 12:
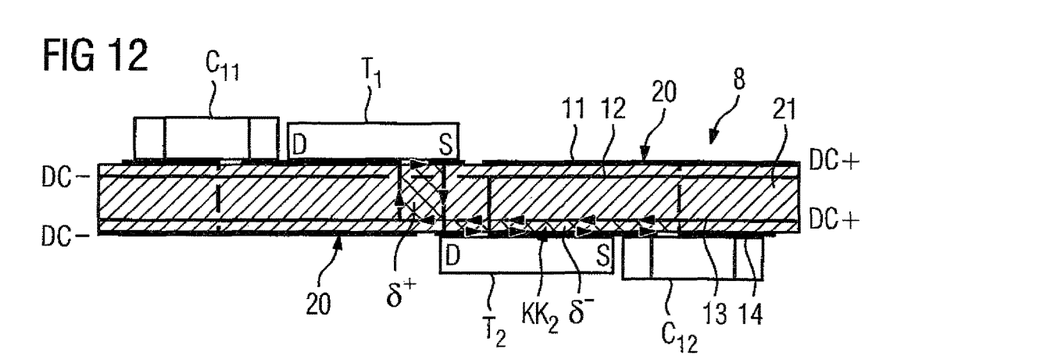
FIG. 12 shows the cross-section of FIG. 11 with a second commutation circuit.

In symmetry therewith, a similar commutation circuit $KK_2$ is created by the symmetrically arranged second switching element $T_2$ and the corresponding capacitor $C_{12}$ of the DC-link capacitor $C_1$, as shown in FIG. 12. Once again the opposing dipoles $\delta^+$ and $\delta^-$ are produced in the same way.

Figure 13:
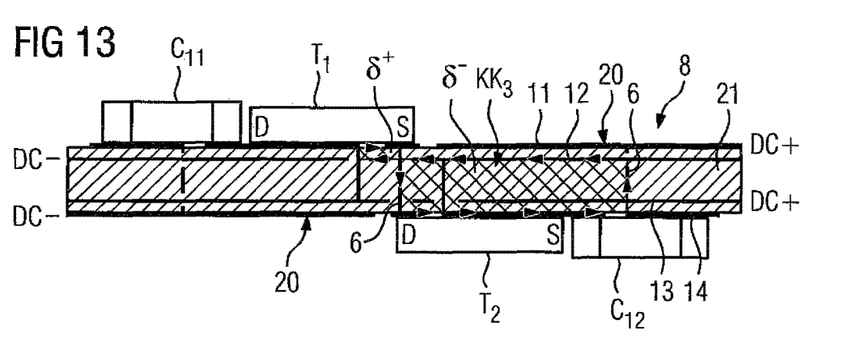
FIG. 13 shows a cross-section of FIG. 11 with a third commutation circuit.

A third commutation circuit $KK_3$ is created as shown in FIG. 13. The commutation circuit here runs from the drain D via the source S of the switching element $T_1$ (first layer 11), on to the drain D and source S of the switching element $T_2$ (fourth layer 14), then through the capacitor $C_{12}$ (fourth circuit trace layer 14) and back via the second circuit trace layer 12 to the drain D of the switching element $T_1$. The corresponding mesh loops again produce the two opposing dipoles $\delta^+$ and $\delta^-$.

Figure 14:
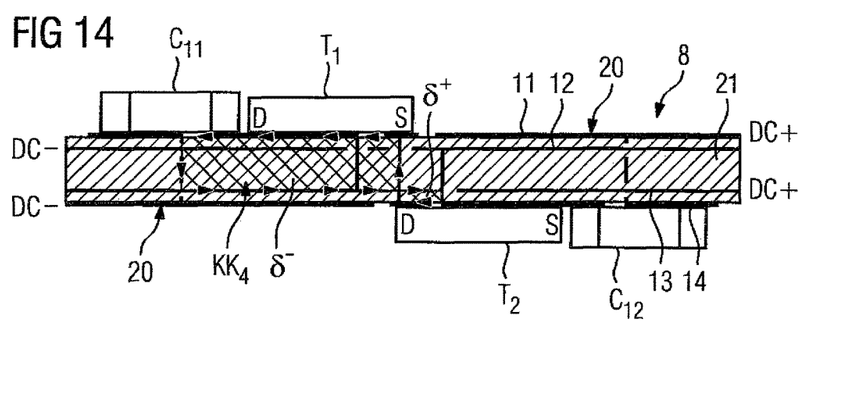
FIG. 14 shows a cross-section of FIG. 11 with a fourth commutation circuit.

Similarly, because of the symmetrical arrangement, a fourth commutation circuit $KK_4$ as shown in FIG. 14 from the source S via the drain D of $T_2$ is created, and so on.

Use of the inner layers means that the commutation paths are routed past one another in a planar manner, which minimizes their inductance. In addition, as shown in FIGS. 11 to 14, parallel commutation circuits $KK_1$ to $KK_4$ are formed, resulting in a paralleling of the respective inductances and thus achieving a further reduction in the total inductance. The concept can be extended as required by additional inner layers, result in further paralleling and thus ever lower inductances in the commutation path.

A particularly important feature in this arrangement is the symmetry of the commutation paths. The commutations currents are thereby additionally canceled out, resulting in low noise emission of the circuit as a whole.

Another aspect relates to the shielding of the center tap (denoted by "AC" in the third layer 13 in FIG. 9) of the half bridge. This center tap oscillates relative to the "fixed" DC-link potentials. This is therefore made as small as possible, resulting in a lower parasitic capacitance and therefore less interference. It should be emphasized that the complete connection is optimally shielded in this way from an EMC standpoint (cf. second layer 12 above it and fourth layer 14 below it).

Vertical mounting is to be recommended as a preferred arrangement for passive cooling of circuit. By this means, heat can be dissipated on both sides of the circuit board 8.

The design shown in the exemplary embodiment can also be used for connecting a plurality of switches (particularly GaN-on-Si switches) in parallel with a driver, the thermal coupling between the switches being particularly important here. Thus, a symmetrical current distribution between the switches is achieved.

The particular advantage of the half-bridge arrangement described above is the specific geometric arrangement of the half-bridge components. Using a multi-layer board and taking the symmetry into account results in a very low-inductance design. A passive heat dissipation solution on the circuit board is also shown, which means that no additional cooling is required. Another positive aspect is the optimized EMC performance, which is of enormous importance particularly for fast-switching devices (GaN-on-Si or Si—C).

The low-inductance design therefore confers advantages due to the parallel commutation paths. The resulting switching overvoltages are smaller and the switching losses lower. In addition, higher switching frequencies are possible, and the inductances can be further reduced by additional inner layers.

In respect of interference immunity, a notable advantage is that less external circuitry is required, higher switching speeds and switching frequencies are possible, and the EMC load is reduced. The latter results in particular from the shielding of the center tap, field cancellation of commutation circuit and drive circuit (perpendicular arrangement) and the fact that the fields of the parallel commutation circuits cancel each other out (symmetrical design).

Another advantage is that the inductances are independent of the board thickness. In particular, low inductances are produced even in the case of high layer thicknesses when the components have to move further apart because of the ramp profile at the copper edges. Lastly, the above half-bridge arrangement also make it possible to optimize cooling. In particular, an improved heat spread over the circuit board as well as two-sided heat dissipation can be achieved.

While the invention has been illustrated and described in connection with currently preferred embodiments shown and described in detail, it is not intended to be limited to the details shown since various modifications and structural changes may be made without departing in any way from the spirit and scope of the present invention. The embodiments were chosen and described in order to explain the principles of the invention and practical application to thereby enable a person skilled in the art to best utilize the invention and various embodiments with various modifications as are suited to the particular use contemplated.

What is claimed as new and desired to be protected by Letters Patent is set forth in the appended claims and includes equivalents of the elements recited therein:

1. A half-bridge arrangement for a converter, comprising two switching elements connected in series at a node, an intermediate circuit capacitor device comprising two capacitors, a circuit board on which the switching elements and the capacitor device are arranged and interconnected to form a half bridge, the circuit board having two major surfaces and at least four trace layers which interconnect the switching elements and the intermediate circuit capacitor device such that, during a commutation event of the half-bridge, at least two magnetic dipoles having opposite spatial directions are produced by current flow in and between the at least four trace layers, and wherein the two capacitors are disposed in a point-symmetric fashion on different major surfaces of the circuit board.

2. The half-bridge arrangement of claim 1, wherein the two switching elements and the two capacitors are each disposed on different major surfaces of the circuit board.

3. The half-bridge arrangement of claim 1, wherein the circuit board has four trace layers which form at least four parallel commutation circuits during the commutation event.

4. The half-bridge arrangement of claim 3, wherein the at least four parallel commutation circuits are formed symmetric with respect to one another.

5. The half-bridge arrangement of claim 1, wherein the node occupies a surface area on the circuit board that is significantly smaller than the surface area of the circuit board so as to increase interference immunity of the half-bridge arrangement.

6. The half-bridge arrangement of claim 5, wherein the surface area occupied by the node is smaller than approximately 5% of the surface area of the circuit board.

7. The half-bridge arrangement of claim 1, wherein the at least four circuit trace layers have a highest possible copper fill factor.

8. The half-bridge arrangement of claim 1, wherein a copper fill factor of the at least four circuit trace layers is optimized for heat dissipation.

9. A half-bridge arrangement for a converter, comprising two switching elements connected in series at a node, an intermediate circuit capacitor device, a circuit board on which the switching elements and the capacitor device are arranged and interconnected to form a half bridge, the circuit board having two major surfaces and at least four trace layers which interconnect the switching elements and the intermediate circuit capacitor device such that, during a commutation event of the half-bridge, at least two magnetic dipoles having opposite spatial directions are produced by current flow in and between the at least four trace layers, and driver devices connected to control terminals of the switching devices in one-to-one correspondence such that a driver current direction of a main current of a driver device is orthogonal to a commutation current direction of the main current for that driver device during the commutation event.

10. The half-bridge arrangement of claim 9, wherein the circuit board has four trace layers which form at least four parallel commutation circuits during the commutation event.

11. A converter comprising: a half-bridge arrangement with two switching elements connected in series at a node, an intermediate circuit capacitor device comprising two capacitors, a circuit board on which the switching elements and the capacitor device are arranged and interconnected to form a half bridge, the circuit board having two major surfaces and at least four trace layers which interconnect the switching elements and the intermediate circuit capacitor device such that, during a commutation event of the half-bridge, at least two magnetic dipoles having opposite spatial directions are produced by current flow in and between the at least four trace layers, and wherein the two capacitors are disposed in a point-symmetric fashion on different major surfaces of the circuit board.

12. The half-bridge arrangement of claim 11, wherein the at least four parallel commutation circuits are formed symmetric with respect to one another.

* * * * *